United States Patent
Hamilton et al.

(10) Patent No.: US 7,038,950 B1
(45) Date of Patent: May 2, 2006

(54) MULTI BIT PROGRAM ALGORITHM

(75) Inventors: Darlene Hamilton, San Jose, CA (US); Ed Hsia, Saratoga, CA (US); Pau-Ling Chen, Saratoga, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 10/982,296

(22) Filed: Nov. 5, 2004

(51) Int. Cl.
  *G11C 11/34* (2006.01)
  *G11C 16/04* (2006.01)
  *G11C 16/06* (2006.01)

(52) U.S. Cl. .............................. 365/185.28; 365/185.2; 365/185.24; 365/185.22

(58) Field of Classification Search ........... 365/185.28, 365/185.24

See application file for complete search history.

(56) References Cited

U.S. PATENT DOCUMENTS

2005/0162921 A1*  7/2005  Kurihara ................ 365/185.24

* cited by examiner

*Primary Examiner*—Michael J. Weinberg
(74) *Attorney, Agent, or Firm*—Eschweiler & Associates, LLC

(57) ABSTRACT

Methods of programming NEW data into unprogrammed bits of a group of memory cells is provided. The method applies an interactive programming algorithm that individually verifies and programs the NEW data, reference (REF) data, and existing or OLD data. OLD data is separately verified to a compensated program verify level from that of the NEW data to improve memory reliability and insure minimal uniform stress levels to the array. The improved programming algorithm prevents older data from being needlessly refreshed, thus mitigating stress to the cells that eventually causes the data areas to decay at different rates and become prematurely unreliable.

21 Claims, 3 Drawing Sheets

MULTI BIT PROGRAM ALGORITHM

FIELD OF INVENTION

The present invention relates generally to memory devices and the like, and in particular to an improved method of programming memory cells in flash memory devices.

BACKGROUND OF THE INVENTION

Many different types and styles of memory exist to store data for computers and similar type systems. For example, random access memory (RAM), dynamic random access memory (DRAM), static random access memory (SRAM), read only memory (ROM), programmable read only memory (PROM), electrically programmable read only memory (EPROM), electrically erasable programmable read only memory (EEPROM) and flash memory are all presently available to accommodate data storage.

Each type of memory has its own particular advantages and disadvantages. For example, DRAM and SRAM allow individual bits of data to be erased one at a time, but such memory loses its data when power is removed. EEPROM can alternatively be easily erased without extra exterior equipment, but has reduced data storage density, lower speed, and higher cost. EPROM, in contrast, is less expensive and has greater density but lacks ease of erasability.

Flash memory, has become a popular type of memory because it combines the advantages of the high density and low cost of EPROM with the electrical erasability of EEPROM. Flash memory can be rewritten and can hold its contents without power, and thus is nonvolatile. It is used in many portable electronic products, such as cell phones, portable computers, voice recorders, etc. as well as in many larger electronic systems, such as cars, planes, industrial control systems, etc.

Flash memory is generally constructed of many memory cells where, generally, single bits of data are stored in and read from respective memory cells. The cells are generally programmed by hot electron injection and erased by Fowler-Nordheim tunneling or other mechanisms. As with many aspects of the semiconductor industry, there is a continuing desire and effort to achieve higher device packing densities and increase the number of memory cells on a semiconductor wafer. Similarly, increased device speed and performance are also desired to allow more data to be stored on smaller memory devices.

Individual flash memory cells are organized into individually addressable units or groups, which are accessed for read, program, or erase operations through address decoding circuitry. The individual memory cells are typically comprised of a semiconductor structure adapted for storing a bit of data and includes appropriate decoding and group selection circuitry, as well as circuitry to provide voltages to the cells being operated upon.

The erase, program, and read operations are commonly performed by application of appropriate voltages to certain terminals of the memory cell. In an erase or write operation the voltages are applied so as to cause a charge to be removed or stored in the memory cell. In a read operation, appropriate voltages are applied so as to cause a current to flow in the cell, wherein the amount of such current is indicative of the value of the data stored in the cell. The memory device includes appropriate circuitry to sense the resulting cell current in order to determine the data stored therein, which is then provided to data bus terminals of the device for access by other devices in a system in which the memory device is employed.

Programming circuitry controls a bit of a cell by applying a signal to a wordline, which acts as a control gate, and changing bitline connections such that the bit is stored by the source and drain connections. Programming a cell using a suitable mechanism such as hot electron injection, generally increases the threshold voltage of a cell. Erasing is performed as a blanket operation wherein an array or sector of cells can be simultaneously erased and typically produces a lower threshold voltage in the cell.

In a NOR configuration, the control gate is connected to a wordline associated with a row of memory cells to form sectors of such cells. In addition, the drain regions of the cells are connected together by a conductive bitline. The channel of the cell conducts current between the source and the drain in accordance with an electric field developed in the channel by the stacked gate structure. Respective drain terminals of the transistors within a single column are connected to the same bitline. In addition, respective flash cells associated with a given bitline have stacked gate terminals coupled to a different wordline, while all the flash memory cells in the array generally have their source terminals coupled to a common source terminal. In operation, individual flash cells are addressed via the respective bitline and wordline using the peripheral decoder and control circuitry for programming (writing), reading or erasing functions.

By way of further detail, the single bit stacked gate flash memory cell is programmed by a suitable mechanism, such as hot electron injection. Programming with hot-electron injection involves applying a relatively high voltage to the control gate and connecting the source to ground and the drain to a predetermined potential above the source. When a resulting electric field is high enough, electrons collect enough energy to be injected from the source onto the control gate. As a result of the trapped electrons, the threshold voltage of the cell increases. This change in the threshold voltage (and thereby the channel conductance) of the cell created by the trapped electrons is what causes the cell to be programmed.

In order to erase a typical single bit stacked gate flash memory cell, a relatively high voltage is applied to the source, and the control gate is held at a negative potential, while the drain may be allowed to float. Under these conditions, a strong electric field is developed across the tunnel oxide between the gate and the source. The electrons that are trapped in the gate flow toward and cluster at the portion of the gate overlying the source region and are extracted from the gate and into the source region by way of Fowler-Nordheim tunneling through the tunnel oxide. As the electrons are removed from the gate, the cell is erased.

For a read operation, a certain voltage bias is applied across the drain to source of the cell transistor. The drain of the cell is the bitline, which may be connected to the drains of other cells in a byte or word group. A source read voltage is applied at the source and a drain read voltage is applied at the drain. The drain read voltage is greater than the source read voltage. A read gate voltage is then applied to the gate (e.g., the wordline) of the memory cell transistor that is greater than the drain read voltage in order to cause a current to flow from the drain to source. The read operation gate voltage is typically applied at a level between a programmed threshold voltage (Vt) and an unprogrammed threshold voltage. The resulting current is measured, by which a determination is made as to the data value stored in the cell.

Another type of flash memory is dual bit memory, which allows multiple bits to be stored in a single cell. In this technology, a memory cell is essentially split into two identical (mirrored) or complementary parts, each of which is formulated for storing one of two independent bits. Each dual bit memory cell, like a traditional cell, has a gate with a source and a drain. However, unlike a traditional stacked gate cell in which the source is always connected to an electrical source and the drain is always connected to an electrical drain, respective dual bit memory cells can have the connections of the source and drain reversed during operation to permit the storing of two bits.

In a virtual ground type architecture, dual bit memory cells have a semiconductor substrate with conductive bitlines. A multilayer storage layer, referred to as a "charge-trapping dielectric layer", is formed over the semiconductor substrate. The charge-trapping dielectric layer can generally be composed of three separate layers: a first insulating layer, a charge-trapping layer, and a second insulating layer. Wordlines are formed over the charge-trapping dielectric layer substantially perpendicular to the bitlines. Programming circuitry controls two bits per cell by applying a signal to the wordline, which acts as a control gate, and changing bitline connections such that one bit is stored by the source and drain being connected in one arrangement and a complementary bit is stored by the source and drain being connected in another arrangement.

After the stress of repeated programming and erase cycles, such flash memory cells tend to exhibit data retention reliability problems. Over time, the program/erase stress may cause the data to decay or lose charge at different rates in some memory cells. Regardless of the flash architecture employed, reliably and accurately programming dual bit and multi-level flash cells can be particularly sensitive with the attendant complications of maintaining narrow Vt distributions in order to reliably read and determine a data state from a corresponding Vt level.

In view of the foregoing, a need exists for an improved method of programming single bit, dual bit, and multi-level flash memory cells in a manner that improves reliability and mitigates stress.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention programs a group or a portion of an array of flash memory cells to a NEW data state by applying an interactive programming algorithm that verifies and programs the NEW data, reference (REF) data, and existing or OLD data, wherein the NEW and OLD data areas are verified and programmed to separately compensated program verify levels to improve memory reliability and insure minimal uniform stress levels. The improved programming algorithm prevents older data from being needlessly refreshed and thus stressed by repeated program/erase (P/E) cycling. Such refresh stress on OLD data eventually causes the NEW and OLD data areas to decay at different rates and become prematurely unreliable. By contrast, conventional methods may indiscriminately program all NEW, REF, and OLD data each program cycle using a common program verify level, without regard to the individual differences in these data areas created by program/erase (P/E) stress.

In one example, the algorithm initially pre-reads the existing data of a user selected group of cells of an array and excludes all programmed data bits. This step avoids refreshing old data (programming over programmed data) and focuses the programming on the unprogrammed (blank) population of cells. The algorithm then interactively programs NEW data into the unprogrammed bits, verifying the programming to a level PV_New established, for example, by an external reference in a state machine of the memory device. Then, according to an aspect of the algorithm, the REF data is verified to determine if it needs to be refreshed, for example, to a PV_refresh_ref level that may also be determined by an external reference. If the REF data needs to be refreshed, the algorithm first reads the OLD data and proceeds to refresh the REF data cells. In accordance with the invention, the PV_New level is then adjusted or otherwise compensated to a PV_refresh level based on, for example, a weighted ratio between the NEW and OLD data or another such functional relationship between the NEW and OLD data within the group. Finally, the algorithm of the present invention interactively programs and verifies the OLD data within the group of cells until the compensated level reflected in the PV_refresh level is achieved.

In another aspect of the invention, the interactive programming operations performed on the memory cells involve applying programming pulses until a desired program verify voltage level (e.g., PV_New, PV_refresh_ref, PV_refresh) corresponding to a desired threshold voltage value having a desired data state is achieved.

In still another aspect of the invention, the Vt of the REF cells utilized comprises a "1" to "0" ratio based on the combination of the "1" to "0" bit data programmed into the addresses the REF cells represent. Further, this combination of the "1" to "0" bit data depends on the width of the I/O bus (e.g., 8 I/O, 16 I/O).

The memory cells of the present invention may comprise one or more physical bits per cell, while the bits themselves may have two or more data states corresponding to two or more threshold voltage values. The memory cells, for example, may comprise single bit cell that can be programmed to three or more levels (multi-level bit, or MLB) corresponding to three or more data states. Alternately, the cells may comprise a dual-bit or mirror-bit cell having two physically distinct bits that may each be programmed to multiple levels such as four, wherein 16 possible states are then available. The method may be suitably implemented in a variety of flash memory architectures including single and dual bit Flash, and other such single or multi-bit, or MLB memory architectures that may be electrically programmed, and any such cell or variant is contemplated as falling within the scope of the present invention.

In this way, the memory cells are programmed to a program verify voltage level compensated according to a ratio or another such function of the difference between the OLD and the NEW data areas applicable to improve memory reliability and insure minimal uniform stress levels.

In accordance with another aspect of the improved programming algorithm of the present invention, the memory cells are initially programmed to various states. Another aspect of the invention provides a method of programming multiple groups of the array including the entire array.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

Figure 1:
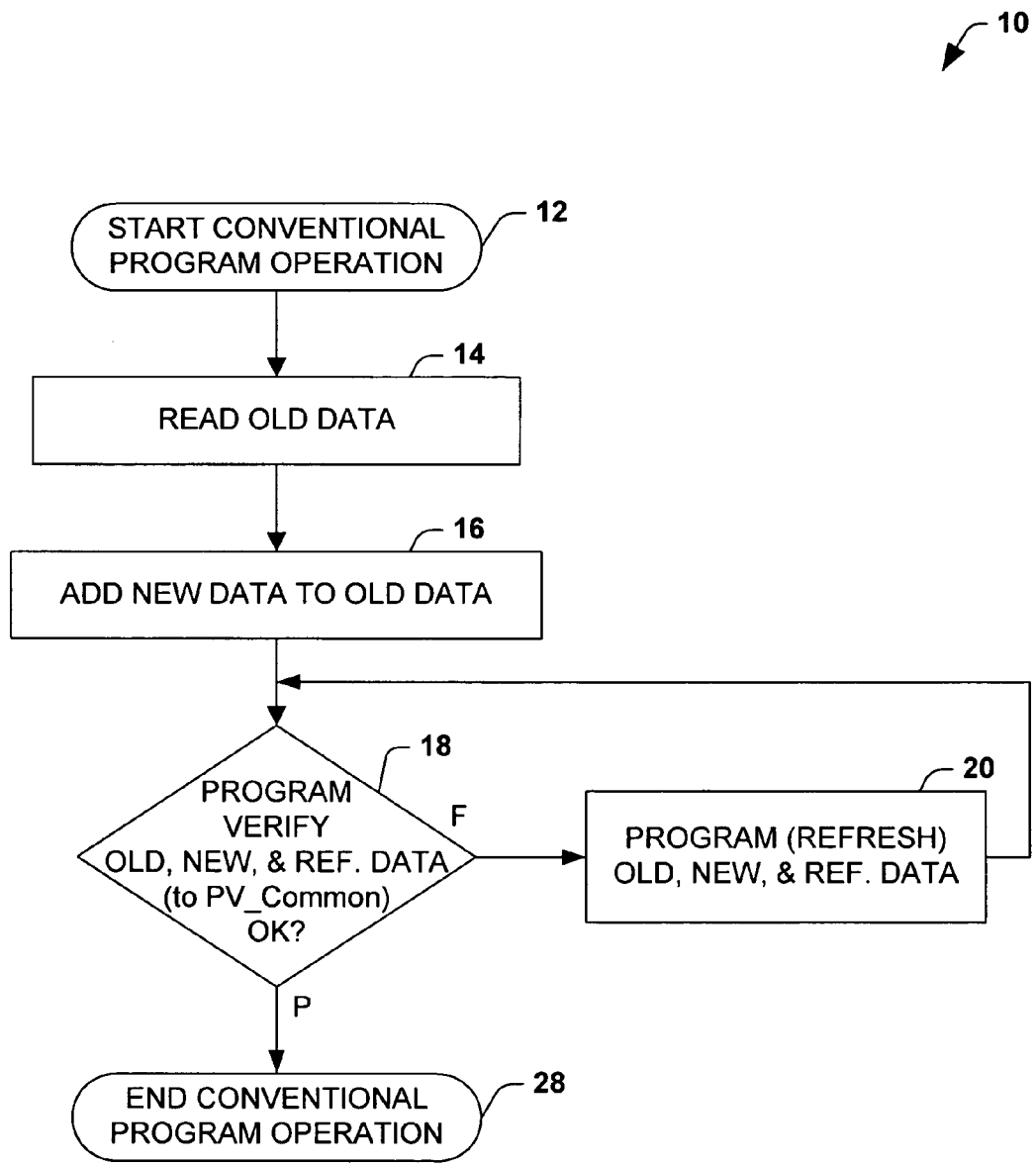
FIG. 1 is flow diagram illustrating a conventional method of programming memory cells to a common program verify level.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, well-known structures and devices are shown in block diagram form in order to facilitate describing one or more aspects of the present invention.

Repeated programming and erase (P/E) cycling stresses flash memory cells. Over time, stressed memory cells tend to exhibit data retention reliability problems wherein data will decay or lose charge at different rates in some memory cells. The contributors to the present invention have observed that the data decay of the stressed memory cells appears to be associated with instantaneous charge losses in those cells. The inventors have also observed that current programming methods tend to produce non-uniformly stressed data areas in an array of memory cells. The inventors have further realized that in conventional methods, when NEW data is to be programmed into unprogrammed memory bits, older (OLD) data is also refreshed in bulk together with the NEW data programming. Initially, this may seem logical, to program the NEW and OLD data areas of a group or array of memory cells, so as to keep the threshold voltages Vt close to the same voltage and stress levels. However, over time and repeated P/E cycles, these NEW and OLD data groupings are constantly being redefined and randomly grouped in different sizes until various groupings of cells become ever more divergent in their rate of charge loss, or their Vt corresponding to a desired data state. Such data areas or groupings may conform to pages, sectors, a combination of these groupings, or any other portion of an array.

Because of these differences that develop in various cell groups over time, the inventors have realized that it can not be assumed that NEW and OLD data areas can be treated equally. In particular, it should not be assumed that when NEW data is programmed, that the OLD data also requires refreshing. Thus, in traditional methods, OLD data may be needlessly refreshed and thus overstressed when programmed in bulk with the NEW data. Such refresh stress on OLD data eventually causes the NEW and OLD data areas to decay at different rates, behave non-uniformly, and to become prematurely unreliable.

When memory cells are programmed from an unprogrammed state to a NEW data state, or when OLD data is refreshed, the level of the programming achieved in a cell (e.g., the Vt of the cell) is verified, in effect, by comparing the cell Vt to a program verify (PV) voltage level. The PV voltage level may be provided by an external reference, for example, in a state machine associated with the memory device. Programming typically continues in this manner applying additional program pulses to the memory cell until a desired PV of a corresponding Vt and data state is achieved.

A reference cell having REF data is assigned to functionally represent a group of associated memory cells of an array or core, wherein the group comprises programmed and unprogrammed memory cells. For example, every 16 addresses of an array may have a pair of REF cells to help distinguish between two possible data states ("1", or "0") that each addresses may be in. Restated, an array or portion of an array of core memory cells each having two data states, may utilize two associated reference cells, each programmed to one of the two data states providing a known reference to represent each data state. The programmed memory cells contain OLD data, whereas the unprogrammed or blank (erased) memory bits are available for programming with NEW data. In particular, reference cells are useful for providing a Vt or data state reference comparison for reading the associated core memory cells and tracking the Vt of those core cells as they decay or degrade.

To accommodate these differences that develop in various memory cell groups, the method of the present invention individually programs and verifies the NEW, REF, and OLD data according to separate PV levels. In addition, the OLD data is programmed and verified to a PV level that is based on, for example, a data weighting factor, ratio, or another such functional relationship between the group of NEW and OLD data in the selected memory cells of an array. The relationship may, for example, correspond to a weighted average of the program/erase cycles of the NEW and OLD memory cell groupings. The group may have one or more associated reference cells.

By contrast, some conventional methods may indiscriminately program all NEW, REF, and OLD data each program cycle using a common program verify level, without regard to the individual differences in these data areas created by program/erase (P/E) stress. The improved programming algorithm prevents older data from being needlessly refreshed and thus over stressed by repeated program/erase (P/E) cycling.

The REF cell in the context of the present invention may comprise a "1" to "0" ratio of a portion of the memory array. For example, and as indicated previously, for every 16 addresses, there is a pair of REF cells to help distinguish between the two possible combinations of programmed and unprogrammed states ("1", or "0") these addresses may be in. The Vt of the REF cells can be modified through either a programming and/or an erase operation, similar to the core cells of the array. The programming/erase, in one implementation, sets the Vt of the REF cells based on the 1-to-0 ratio of the 16 addresses they represent. Once set, the REF cells are not used until the user accesses the read mode. The customer will simply initiate a "read operation", and the state machine will take care of the rest.

In the read mode the REF cells can be used to determine the correct logic state of the address. Since the REF cells are programmed and erased along with the core cells of the memory array, they provide better tracking to the core cells, particularly after many P/E cycles. Thus, the purpose of the REF cells in one implementation of the present invention is to determine the proper logic state of the core array addresses during the read state. The logic states of the REF cells are modified during core array programming/erase, hence they "track" the core array.

Referring initially to FIG. 1, a flow diagram of a conventional programming method 10 for a group of flash memory cells is illustrated. Conventional method 10 programs the NEW, OLD and REF data areas of the flash memory cells to a common program verify level, for example, to PV_Common.

Method 10 begins at 12, wherein a portion of the core array and the associated reference cells of the array are conventionally programmed with a new data pattern or another form of data. At 14, this existing or OLD memory data residing in the memory cells is then read. The NEW user data is then added to the OLD data at 16 to identify those areas of the array where the NEW data must actually be programmed. At 18, all addresses of the NEW, OLD, and REF data is first read and at 20, only those address bits which are not at the current program verify level, such as PV_Common, are programmed or refreshed until PV_Common is obtained and the method ends at 28. All NEW, OLD, and REF addresses are treated equally in this conventional method, verifying and programming them in a sequential address fashion. NEW and OLD data address may be essentially intermixed or jumbled together.

While the conventional method 10 reinforces the data states stored in the array, at the same time, the OLD data areas of the memory tend to become over-stressed, if they do not need to be refreshed when the NEW data is programmed. Later, the memory will fill or otherwise need to be erased. This is a program/erase P/E cycle. After many such P/E cycles, the array becomes further stressed. Because of the way in which this is accomplished, degradation may take place in the cells of the array due to stress aging at an increased rate. Eventually, the decay rate of the cells increases and the cells lose charge fast enough until they may suddenly change their data state and data is lost. Thus, an objective of the method of the present invention is to protect the memory array from refresh related data corruption, thereby improving data retention reliability.

Although the methodology is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects of the present invention. Further, one or more of the acts may be carried out in one or more separate acts or phases.

Figure 2:
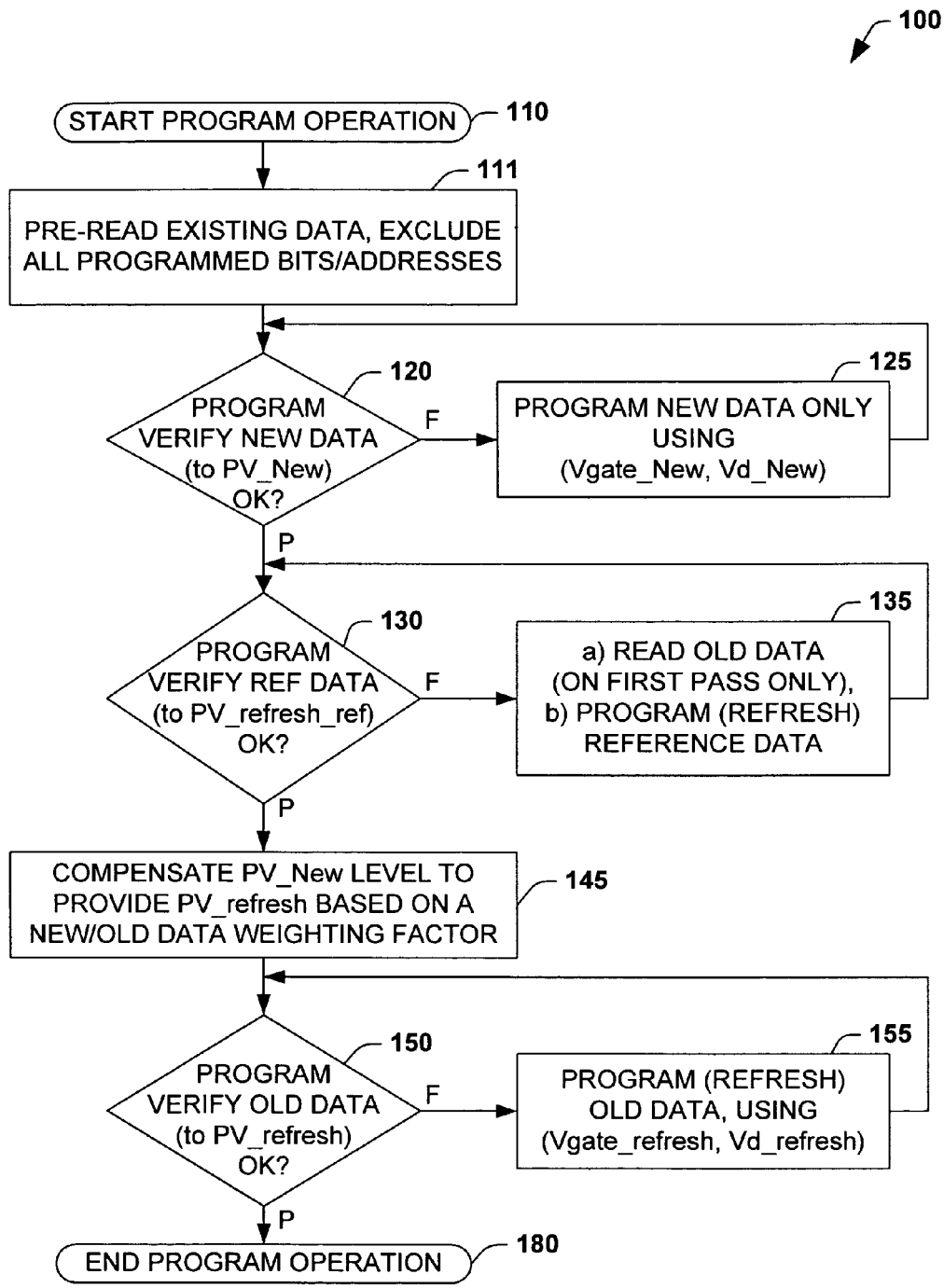
FIG. 2 is flow diagram illustrating an exemplary method of programming a group of memory cells comprising NEW and OLD data areas to separately compensated program verify levels in accordance with an aspect of the present invention.

FIG. 2, illustrates a flow diagram of an exemplary method 100 of programming a group or another such portion of an array of flash memory cells in accordance with an aspect of the present invention. In the method 100, NEW and OLD data areas are programmed and program verified to separate program verify levels established based on the differences, which exist between the NEW and OLD data areas. The method 100 may be suitably implemented in a variety of flash memory architectures including single and dual bit Flash, and other such single or multi-bit memory architectures having two or more data states per bit that may be electrically programmed, and any such cell or variant is contemplated as falling within the scope of the present invention.

The method 100 of the present invention comprises programming NEW data into unprogrammed bits of a group of memory cells, the group comprising the unprogrammed bits and programmed bits having existing or OLD data. The method applies an interactive programming algorithm that individually verifies and programs the NEW data, reference (REF) data, and existing or OLD data in separate batches. OLD data is separately verified to a compensated program verify level from that of the NEW data to improve memory reliability and insure minimal uniform stress levels to the array. The improved programming algorithm 100 prevents older data from being needlessly refreshed, thus mitigating stress to the cells that eventually causes the data areas to decay at different rates and become prematurely unreliable.

The programming algorithm 100 begins at 110, wherein an array or a portion of an array of memory cells is provided that has been at least partially programmed with some type of user supplied data. For example, a user may wish to program NEW data in a page, sector, or another area of core memory in accordance with the method 100 of the present invention. The core memory area may contain programmed bits containing OLD data and unprogrammed (blank) bits. The memory further comprises reference cells having REF data associated with the selected area of core memory. Initially, the selected area of memory is pre-read at 111, excluding those programmed bits, which contain OLD data (programmed bits) to identify the unprogrammed bit addresses that will receive the NEW data programming. Note, the blank bits are not excluded. In this way, the programming algorithm may focus on the remaining blank or otherwise unprogrammed memory bits of the array, wherein NEW data is programmed. The NEW data for the unprogrammed memory bits is program verified at 120 to a program verify voltage level (e.g., using a Vgate_New, and a Vd_New) and programmed with NEW data at 125 until the Vt of the memory bits generally correspond to the data state of the NEW data. Typically, for example, program pulses are interactively applied to the unprogrammed bits until the Vt of the cells generally corresponds to a pre-established (e.g., in a state machine associated with the memory device) program verify level (e.g., until PV_New=6.5 volts at 120) corresponding to a desired data state. Although only single PV levels are discussed herein with respect to the NEW, REF, and OLD data, it is appreciated that a plurality of PV levels may also be utilized in each of the steps of the method as it applies to multi-level bit (MLB) memory cells, or multi-bit per cell architectures.

If it is determined at 130 that a group of reference cells having REF data associated with the NEW and OLD data need to be refreshed, the OLD data is initially read at 135a on the first programming pass (e.g., and temporarily stored for later use such as in a buffer memory) and the REF data in the reference cells is then programmed (refreshed) at 135b until a PV_refresh_ref level (e.g., 6.4 volts) is achieved at 130. PV_refresh_ref, for example, may also be a second pre-established PV level provided by the state machine, based on some function of the NEW and OLD data that the reference cells are associated with. In accordance with the programming method 100 of the present invention, as the reference cells are programmed 135b and verified 130 to the PV_refresh_ref level, information associated with the NEW and OLD data is accumulated and used to compute an adjusted or compensated PV level (e.g., PV_refresh) 145, which is used for verifying the OLD data at 150.

To achieve PV_refresh, the PV_New level may be mathematically combined 145, for example, using a variety of functional relationships of the new mix of NEW and OLD data derived from the reference cells. For example the Vt of the REF cells may comprise a "1" to "0" ratio of the 16 addresses the REF cells represent. The function used in the calculation of the PV_refresh level, for example, may further include OLD and NEW weighting factors generally corresponding to the OLD and NEW data. In other words, the verification of the REF data is a precursor or a test methodology to find out what the PV value should be for verifying the OLD data, because we can assume that the REF data is, in a sense, OLD data.

Finally, at 155 the OLD data is programmed (refreshed) until it is verified at 150 that the Vt of the memory cells generally correspond to the compensated PV_refresh voltage level now adjusted to, for example, 6.1 volts. Optionally, a corresponding adjustment to the gate voltage Vgate_refresh, and the drain voltage Vd_refresh values associated with the OLD data bits, for example, may be supplied to the memory device if desired to further enhance the compensation or the refresh of the OLD data. Thereafter, the improved programming method 100 ends at 180.

In the context of single, multi-bit, and multi-level bit (MLB) implementations of the present invention, discussions of a PV value such as PV_refresh, are intended to include, but not be limited to a plurality of PV levels for each of the possible Vt levels and corresponding data states. For example, a four-level bit architecture implementation may comprise a PV_refresh1, a PV_refresh2, a PV_refresh3, and a PV_refresh4 representing the four Vt's and the plurality of PV levels.

The order and structure of the improved programming method 100 provides further benefits. For example, initially reading the OLD data on the first program verify pass at 135, provides an inherent waiting step between a read of the OLD data and a subsequent refresh of the OLD data. This wait allows time for the OLD data to be read and settle before the OLD data is verified and programmed, yielding a more accurate program level. The conventional method 10 mixes all NEW, REF and OLD data during the programming operation, while the new method 100 of the present invention separates NEW, REF and OLD, data areas into batches for individually compensated verification and programming to accommodate differences which may develop in these areas. Batching these data areas in the present invention further provides intrinsic delay timings useful for further comparison analysis in the compensation calculations of step 145. The order and batching of the data areas further provides reduced programming times in the present invention.

Figure 3:
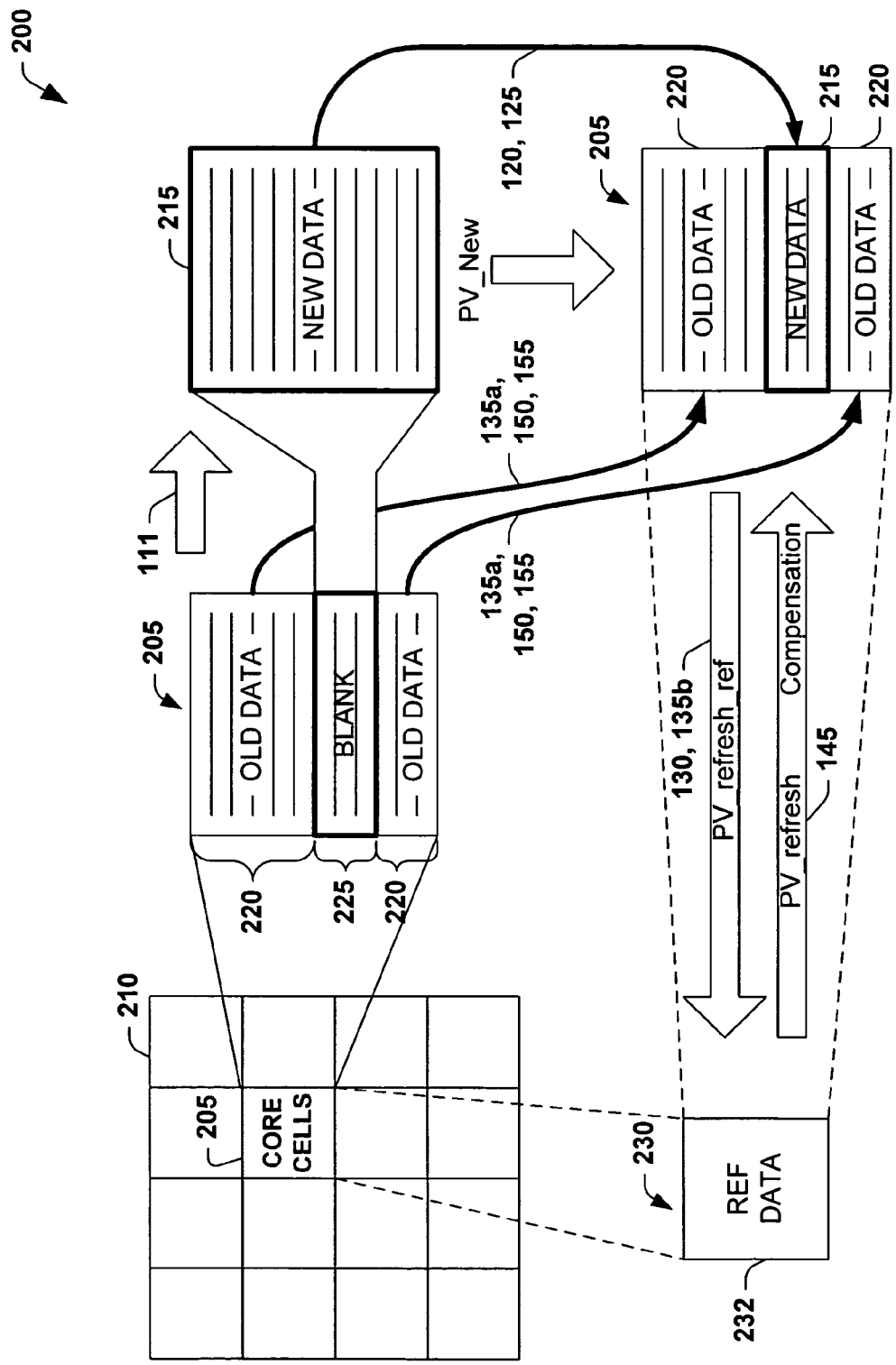
FIG. 3 is a simplified functional memory map illustrating selected aspects of the correspondence between the various data areas of the exemplary method flow of FIG. 2 in accordance with the present invention.

FIG. 3 illustrates a simplified functional memory map 200 of select aspects of the correspondence between the various memory data areas of the exemplary method 100 of FIG. 2 in accordance with the present invention. The present invention relates to a method 100 of programming data in a page, a sector, or another array portion 205 of an array of core memory cells 210. The user of the memory device selects such an array portion 205 and a pattern of NEW data 215 to program into the selected array portion 205. The array portion 205 may currently have programmed bits containing OLD data 220 as well as unprogrammed (blank) bits 225.

The memory array 210 further comprises reference cells 230 containing REF data 232 specifically associated with or representing the selected array portion 205 of core memory 210.

In the programming method 100 of the present invention, the existing data within the array portion 205 is first pre-read 111, excluding those addresses that contain OLD data 220 (programmed bits) to identify the unprogrammed or blank bits 225. As such, these unprogrammed or blank bits 225 are available for receiving programming of the NEW data 215.

The NEW data 215 is then verified 120 and programmed 125 into the unprogrammed bits 225 until a pre-established PV_New level is attained. At this point, the REF data 232 in the reference cells 230, basically represents the OLD data 220 from a previous programming operation. Thus, if it is determined 130 that the reference cells 230 require a refresh, the OLD data 220 is initially read 135a on the first programming pass. Thereafter, the REF data 232 in the reference cells 230 is programmed 135b and again verified 130 to a second pre-established PV_refresh_ref level based on the level of PV_New and a function of the NEW data 215 and OLD data 220 in the associated array portion 205.

As the reference cells 230 are programmed 135b and verified 130 to the PV_refresh_ref level, information associated with the NEW data 215 and OLD data 220 is accumulated and used to determine 145 a compensated PV level (e.g., PV_refresh) for verifying the OLD data 220. To achieve PV_refresh, the PV_New level is mathematically combined 145 with a variety of functional relationships of the new mix of NEW data 215 and OLD data derived from the reference cells. Thereafter, the OLD data 220 is verified 150 and refreshed 155 to the adjusted or compensated PV_refresh level.

In addition, the mix of New/Old data need not necessarily be limited to that which is illustrated and described in association with 205 of FIG. 3. For example, New data 215 may be programmed on top of Old data 220. If address X has 00110011 data representing the binary configuration for the 8 I/O's, wherein I/O 0 is the least significant bit (LSB) on the right, and I/O 7 is the most significant bit (MSB) on the left, and wherein the New data for address X is 00000000 data. Then I/O bits 2, 3, 6, 7 can be excluded (step 111) in accordance with the present invention, and the New data can be simply programmed into the remaining I/O's (e.g., bits 0, 1, 4, 5). However, if the New data is 11000000, then this can not be done, since I/O's 6 and 7 can not be programmed from their "0" state back into a "1" state. Instead, all the bits (or I/O's) in all the addresses within that page/sector, for example, would have to be programmed to "O's", erased, then have all the addresses programmed with the New data.

The algorithm achieves well controlled compact Vt distributions of the multi-level memory cells, thereby effectively allowing for higher device density and memory capacity with improved erase speed and efficiency. The erase algorithm and method of the invention is interactively applied and uniformly distributed across each sector of the array in the two phases.

An improved method of programming NEW data into unprogrammed bits of a group of flash memory cells is suitably implemented in single and multiple bit cells as well as multi-level memory cells in accordance with the method of the present invention. The method achieves improved memory reliability, increases programming speed, and insures minimal uniform programming stress levels to the array by preventing older data from being needlessly refreshed.

Although the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method of programming NEW data into unprogrammed bits of a group of memory cells, the group comprising the unprogrammed bits and programmed bits having OLD data, the method comprising:
   pre-reading the group of cells to identify and exclude from NEW data programming operations all addresses of the programmed memory bits having OLD data;
   verifying a programming operation on the unprogrammed memory bits by identifying whether a PV_New voltage level of the unprogrammed bits generally corresponds to the NEW data;
   performing a programming operation on the group of unprogrammed memory bits until it is determined that the PV_New voltage level generally corresponds to the NEW data;
   verifying a programming operation on a group of reference bits having REF data associated with the NEW and OLD data by identifying whether a PV_refresh_ref voltage level of the reference cells generally corresponds to the REF data;
   reading the OLD data if it is determined that the PV_refresh_ref voltage level of the reference cells does not generally correspond to the REF data;
   performing a programming operation on the group of reference cells until it is determined that the PV_refresh_ref voltage level of the reference cells generally corresponds to the REF data;
   providing a compensated PV_refresh voltage level based on the PV_refresh_ref voltage level and a functional relationship between the NEW data and the OLD data;
   verifying a programming operation on the programmed memory bits by identifying whether the PV_refresh voltage level of the cells generally corresponds to the OLD data; and
   performing a programming operation on the group of programmed memory bits until it is determined that the PV_refresh voltage level generally corresponds to the OLD data.

2. The method of claim 1, wherein pre-reading the group of cells to identify and exclude from NEW data programming operations all addresses of the programmed memory bits having OLD data comprises:
   reading a current memory bit from the group of memory cells;
   determining whether the current memory bit has been programmed based on whether OLD data was read from the current bit;
   excluding the current bit if OLD data was read from the current bit;
   determining whether all bits have been excluded from the group of memory cells and if OLD data was read from the current bit;
   executing a program/erase cycle if it has been determined that all bits have been excluded from the group of memory cells;
   incrementing the current bit address if it was determined that all bits have not been excluded from the group of memory cells, and continuing reading other bits of the group of memory cells;
   determining whether the last address of the group of memory cells has been achieved, if it has been determined that the current memory bit has not been programmed based on whether OLD data was read from the current bit; and
   incrementing the current bit address if it was determined that the last address of the group of memory cells has not been achieved.

3. The method of claim 1, wherein the memory cells have one or more physical bits per cell, and the bits have two or more data states corresponding to two or more threshold voltage values.

4. The method of claim 1, further comprising:
   determining whether the NEW data is blank subsequent to verifying a programming operation on the unprogrammed memory bits by identifying whether a PV_New voltage level of the unprogrammed bits generally corresponds to the NEW data;
   performing a programming operation on the group of unprogrammed memory bits if it is determined that the New data is not blank, until it is determined that the PV_New voltage level generally corresponds to the NEW data; and
   performing a programming operation on the group of programmed memory bits containing OLD data if it is determined that the New data is blank, until it is determined that the PV_refresh voltage level generally corresponds to the OLD data.

5. The method of claim 1, wherein the providing a compensated PV_refresh voltage level based on the PV_refresh_ref voltage level and a functional relationship between the NEW data and the OLD data comprises computing a "1" to "0" ratio of the OLD and NEW data represented by the REF cells.

6. The method of claim 1, wherein the functional relationship between the population of the NEW data and the OLD data, further comprises an OLD and a NEW weighting factor generally corresponding to the OLD and NEW data.

7. The method of claim 1, wherein the programming operation on the group of unprogrammed memory bits comprises:
   applying programming pulses until a desired program verify voltage level PV_New corresponding to a desired threshold voltage value of the bits having a desired NEW data state is achieved.

8. The method of claim 1, wherein the programming operation on the group of reference cells comprises:

applying programming pulses until a desired program verify voltage level PV_refresh_ref corresponding to a desired threshold voltage value of the cells having a desired REF data state is achieved.

9. The method of claim 1, wherein the programming operation on the group of programmed memory bits, to refresh the OLD data comprises:

applying programming pulses until a desired program verify voltage level PV_refresh corresponding to a desired threshold voltage value of the bits having a desired OLD data state is achieved.

10. The method of claim 1, wherein the program verify voltage level PV_New corresponding to the NEW data is substantially the same voltage level as the program verify voltage level PV_refresh corresponding to the OLD data.

11. The method of claim 1, wherein the program verify voltage level PV_New corresponding to the NEW data is substantially the same voltage level as the program verify voltage level PV_refresh_ref corresponding to the REF data and the program verify voltage level PV_refresh corresponding to the OLD data.

12. The method of claim 1, wherein the program verify voltage level PV_New corresponding to the NEW data is a different voltage level than the program verify voltage level PV_refresh corresponding to the OLD data.

13. The method of claim 1, wherein the providing a compensated PV_refresh voltage level based on the PV_refresh_ref voltage level and a functional relationship between the NEW data and the OLD data comprises computing a PV_refresh voltage level generally conforming to the relationship:

$$PV\_refresh = PV\_refresh\_ref * Vt\_avg\_New / Vt\_avg\_Old$$

wherein Vt_avg_New generally corresponds to the average threshold voltage level of the NEW data, and wherein Vt_avg_Old generally corresponds to the average threshold voltage level of the OLD data before the OLD data is refreshed.

14. The method of claim 1, further comprising pre-programming a portion of the memory cells prior to pre-reading the group of memory cells.

15. The method of claim 1, wherein the programming operations increase the threshold voltage values generally corresponding to bits of respective memory cells of the group.

16. The method of claim 1, wherein different portions of the group of memory cells are initially programmed to different threshold voltage values.

17. The method of claim 1, wherein the group of memory cells comprises a portion of a larger array of memory cells, wherein different portions of the array of memory cells are initially programmed to different threshold voltage values.

18. The method of claim 1, wherein one or more gate and drain voltages used in the verify and program operations are adjusted to further optimize the method.

19. The method of claim 1, wherein the cells are multi-level bit cells, and the program verify levels represent a plurality of program verify levels per bit, and wherein each corresponding PV_refresh level is compensated for verification of the OLD data.

20. The method of claim 1, wherein multiple groups of memory cells of the array are programmed.

21. The method of claim 1, wherein the group of memory cells comprises a portion of an array of memory cells.

* * * * *